(12) United States Patent
Sato

(10) Patent No.: US 8,437,723 B2
(45) Date of Patent: May 7, 2013

(54) AMPLIFIER CIRCUIT AND COMMUNICATION DEVICE

(75) Inventor: Masaru Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 305 days.

(21) Appl. No.: 12/896,517

(22) Filed: Oct. 1, 2010

(65) Prior Publication Data

US 2011/0081879 A1    Apr. 7, 2011

(30) Foreign Application Priority Data

Oct. 2, 2009   (JP) ................. 2009-230807

(51) Int. Cl.
H04B 1/18       (2006.01)
H03F 3/04       (2006.01)
H03F 3/68       (2006.01)

(52) U.S. Cl.
USPC ............ 455/293; 455/341; 330/297; 330/310

(58) Field of Classification Search .............. 455/78, 455/82, 83, 280, 281, 282, 292, 293, 334, 455/338, 341; 330/277, 296, 297, 310, 165, 330/195

See application file for complete search history.

(56) References Cited

U.S. PATENT DOCUMENTS 5,742,205 A       4/1998  Cowen et al.
6,066,993 A *    5/2000  Yamamoto et al. ........... 333/103
7,468,636 B2 *  12/2008  Matsuda et al. .............. 330/302
2008/0094142 A1 *  4/2008  Kawashima et al. ........ 330/296
2008/0204148 A1    8/2008  Kim et al.

FOREIGN PATENT DOCUMENTS

| EP | 1096668 A1 | 5/2001 |
| EP | 1693956 A1 | 8/2006 |
| JP | 47-18962   | 6/1972 |
| JP | 2000-223963 | 8/2000 |
| JP | 2002-515196 | 5/2002 |
| JP | 2004-343517 | 12/2004 |
| JP | 2008-141475 A | 6/2008 |

OTHER PUBLICATIONS

"European Search Report", mailed by EPO and corresponding to European application No. 10178406.4 on May 20, 2011.
Jun-Chau, Chien et al.,"40-Gb/s High-Gain Distributed Amplifiers with Cascaded Gain Stages in 0.18-μm CMOS", IEEE Journal of Solid-State Circuits, ILEE Service Centre, Piscataway, NJ, USA, vol. 42, No. 12; Dec. 1, 2007, pp. 2715-2725.
Japanese Office Action mailed Jan. 22, 2013 for corresponding Japanese Application No. 2009-230807, with English-language Summary.

* cited by examiner

*Primary Examiner* — Nguyen Vo
(74) *Attorney, Agent, or Firm* — Fujitsu Patent Center

(57) ABSTRACT

There is provided an amplifier circuit including: a first transistor having a source thereof connected to an input port and having a gate thereof grounded; a second transistor having a gate thereof grounded; a first inductor provided between a drain of the first transistor and a source of the second transistor; and a second inductor provided between a drain of the second transistor and an output port.

14 Claims, 8 Drawing Sheets

F I G. 4
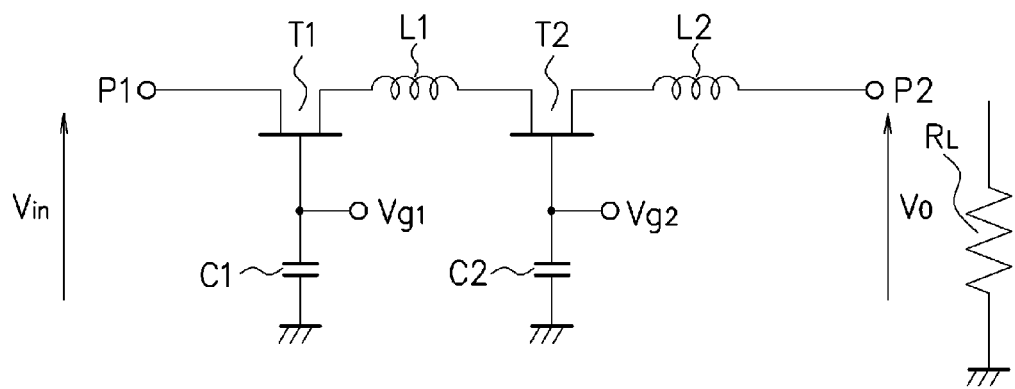

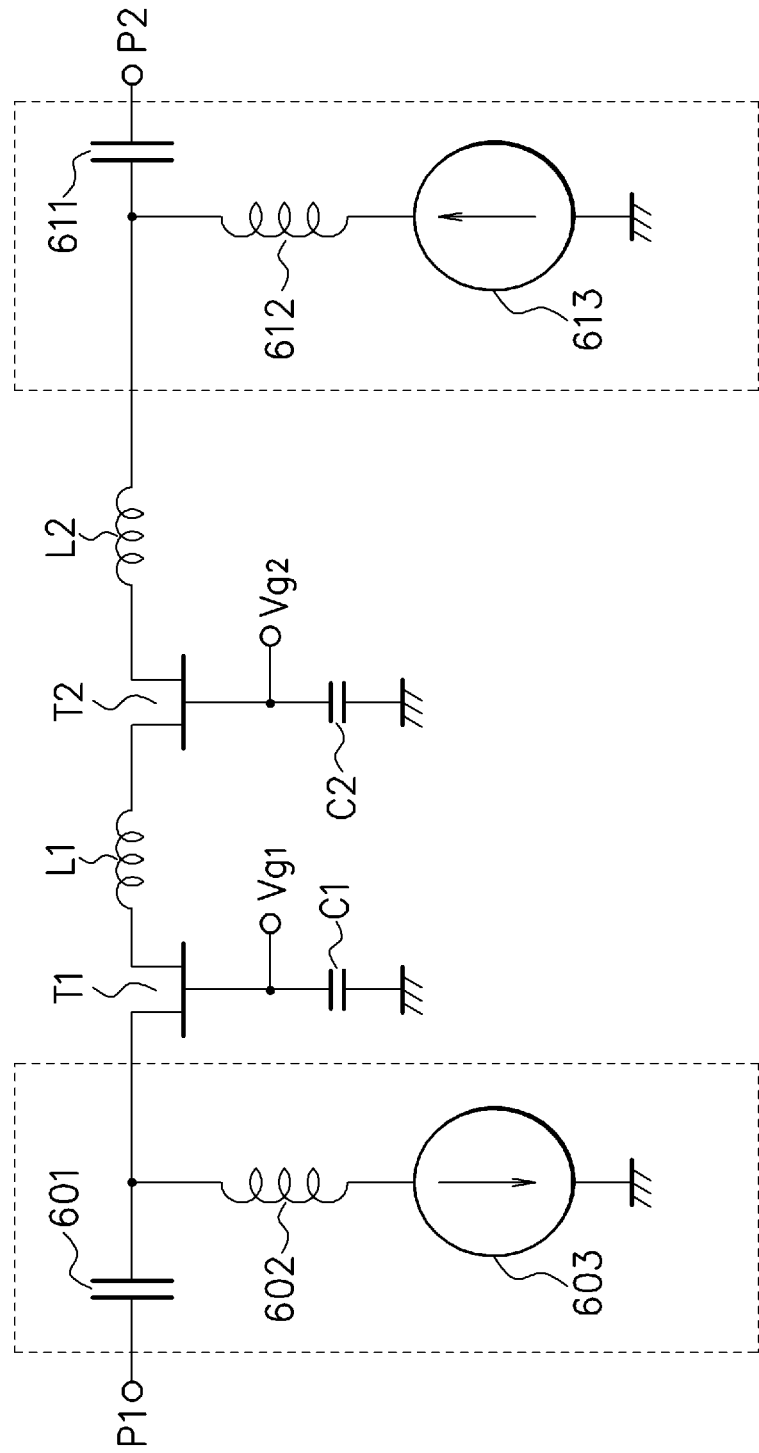
F I G. 6

AMPLIFIER CIRCUIT AND COMMUNICATION DEVICE

CROSS-REFERENCE TO RELATED APPLICATIONS

This application is based upon and claims the benefit of priority of the prior Japanese Patent Application No. 2009-230807, filed on Oct. 2, 2009, the entire contents of which are incorporated herein by reference.

FIELD

The present embodiments relate to an amplifier circuit and a communication device.

BACKGROUND

For a high frequency application, an amplifier circuit amplifying a signal is essential. In order to increase amplification (a gain) of an amplifier circuit, there has been employed a method in which unit amplifier circuits are cascade-connected. Normally, there have been employed methods in which grounded-source transistors are cascade-connected and a grounded-source transistor and a grounded-gate transistor are cascade-connected. In the above case, there is a need to match (for matching) each of the transistors, and it is difficult to obtain high amplification over a broad band. To describe concretely, an input of a grounded-source amplifier circuit is capacitive, and there is often a case that inductors are used in series in order to match the input to an input impedance, (which is 50Ω normally). The input is well matched in the vicinity of a center frequency of a matching circuit as above, and thus a gain is large, but at a frequency away from the center frequency, a gain is reduced due to mismatching. As described above, the amplifier circuit using a grounded-source transistor at an input stage has a difficulty in obtaining amplification over wide frequencies.

There has been known a circuit in which a feedback circuit composed of a resistance and a capacitance is disposed between an input and an output of a circuit in which grounded-gate transistors are connected in two stages. The feedback circuit is interposed between the input and the output to thereby reduce input and output impedances over a broad band. It is not possible for the above circuit to fulfill a purpose with regard to the point of increasing a gain. Next, a reason thereof is described. In the above circuit, the input impedance of the grounded-gate amplifier circuit expressed as 1/gm has to be set higher than an impedance of the feedback circuit. Concretely, it is necessary to make gm small by using transistors with small gate widths. Eventually, since gm is made small, a voltage gain is reduced.

[Patent Document 1] Japanese Laid-open Patent Publication No. 2008-141475

SUMMARY

An amplifier circuit includes: a first transistor having a source thereof connected to an input port and having a gate thereof grounded; a second transistor having a gate thereof grounded; a first inductor provided between a drain of the first transistor and a source of the second transistor; and a second inductor provided between a drain of the second transistor and an output port.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 is a circuit diagram depicting a configuration example of a two-stage grounded-gate amplifier circuit according to a first embodiment;

FIG. 6 is a circuit diagram depicting a configuration example of a two-stage grounded-gate amplifier circuit according to a second embodiment;

DESCRIPTION OF EMBODIMENTS

Reference Arts

Figure 1:
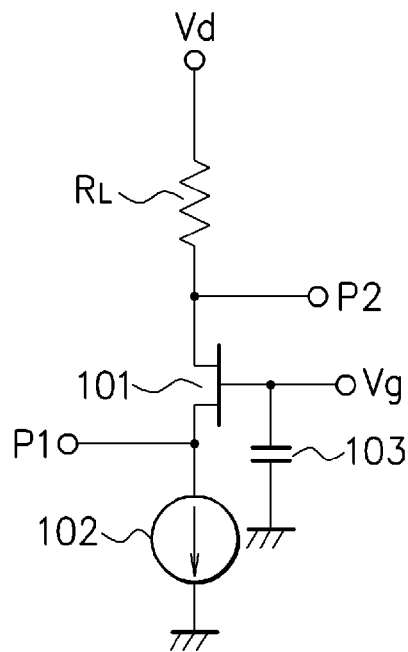
FIG. 1 is a circuit diagram depicting a configuration example of a grounded-gate amplifier circuit.

FIG. 1 is a circuit diagram depicting a configuration example of a grounded-gate amplifier circuit. An n-channel field-effect transistor 101 has a source thereof connected to a reference potential node via a current source 102, has a gate thereof connected to a gate bias voltage node Vg, and has a drain thereof connected to a drain bias voltage node Vd via a load resistance RL. A capacitance 103 is connected between the gate of the transistor 101 and a reference potential node. An input port P1 is connected to the source of the transistor 101. An output port P2 is connected to the drain of the transistor 101. The grounded-gate amplifier circuit amplifies a signal to be input to the input port P1 and outputs the amplified signal from the output port P2.

In the grounded-gate amplifier circuit, an input impedance is expressed as 1/gm. gm is a mutual conductance of the transistor 101. The input impedance 1/gm can be set to a fixed value of 50Ω or so over a high bandwidth by increasing and decreasing a size (gate width, exactly) of the transistor 101 to select the appropriate gate width. On the other hand, an output impedance of the grounded-gate transistor 101 is high. The output impedance becomes the load resistance RL. When the output impedance is desired to be matched to 50Ω, the load resistance RL also has to be set to 50Ω. A voltage gain Kv of the grounded-gate amplifier circuit is expressed by gm×RL. When a condition as above is substituted in gm×RL, the voltage gain Kv results in gm×RL=(1/50)×50=1. As described above, it is difficult to increase the voltage gain Kv while maintaining the input and output impedances of the grounded-gate amplifier circuit at 50Ω.

Figure 2:
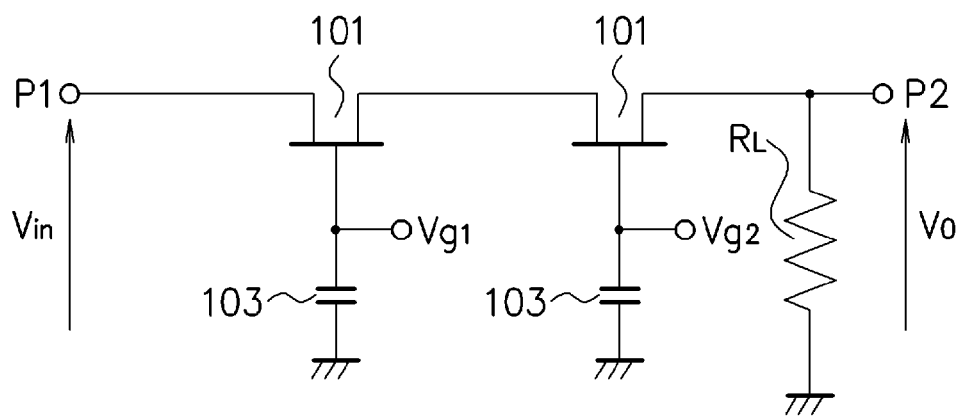
FIG. 2 is a circuit diagram depicting a configuration example of a two-stage grounded-gate amplifier circuit.

FIG. 2 is a circuit diagram depicting a configuration example of a two-stage grounded-gate amplifier circuit. Two grounded-gate transistors 101 are cascode-connected. A gate bias voltage node Vg1 is connected to a gate of the first stage transistor 101. A gate bias voltage node Vg2 is connected to a gate of the second stage transistor 101.

Capacitances 103 are connected to the gates of the two transistors 101 respectively. A load resistance RL is connected between an output port P2 and a reference potential node. An input port P1 is connected to a source of the first stage transistor 101 and has a voltage Vin input thereto. The output port P2 is connected to a drain of the second stage transistor 101 and outputs a voltage Vo.

A voltage gain Kv of the two-stage grounded-gate amplifier circuit is expressed by the following Expression (1). Here, gm is a mutual conductance of each of the transistors 101, ω is an angular frequency of a signal to be input to the input port P1, and Cgd is a gate-to-drain capacitance of each of the transistors 101.

[Expression 1]

$$Kv = \frac{g_m \cdot R_L}{\sqrt{(1 - R_L/g_m \cdot (\omega \cdot C_{gd})^2)^2 + (\omega \cdot C_{gd} \cdot (R_L + 1/g_m))^2}} \quad (1)$$

In the two-stage grounded-gate amplifier circuit, an input impedance is 1/gm, and an output impedance is RL. When the input impedance and the output impedance are matched to 50Ω, RL=1/gm is obtained. When a condition as above is substituted in Expression (1), Expression (2) is established.

[Expression 2]

$$Kv = \frac{1}{\sqrt{(1 - (\omega \cdot C_{gd} \cdot R_L)^2)^2 + (2\omega \cdot C_{gd} \cdot R_L)^2}} \quad (2)$$

Here, 1≫ ω·Cgd·RL is established, so that the voltage gain Kv becomes almost one by Expression (2). Even in the case when the grounded-gate transistors 101 are cascade-connected in two stages, the voltage gain Kv is almost one, which is small.

Figure 3:
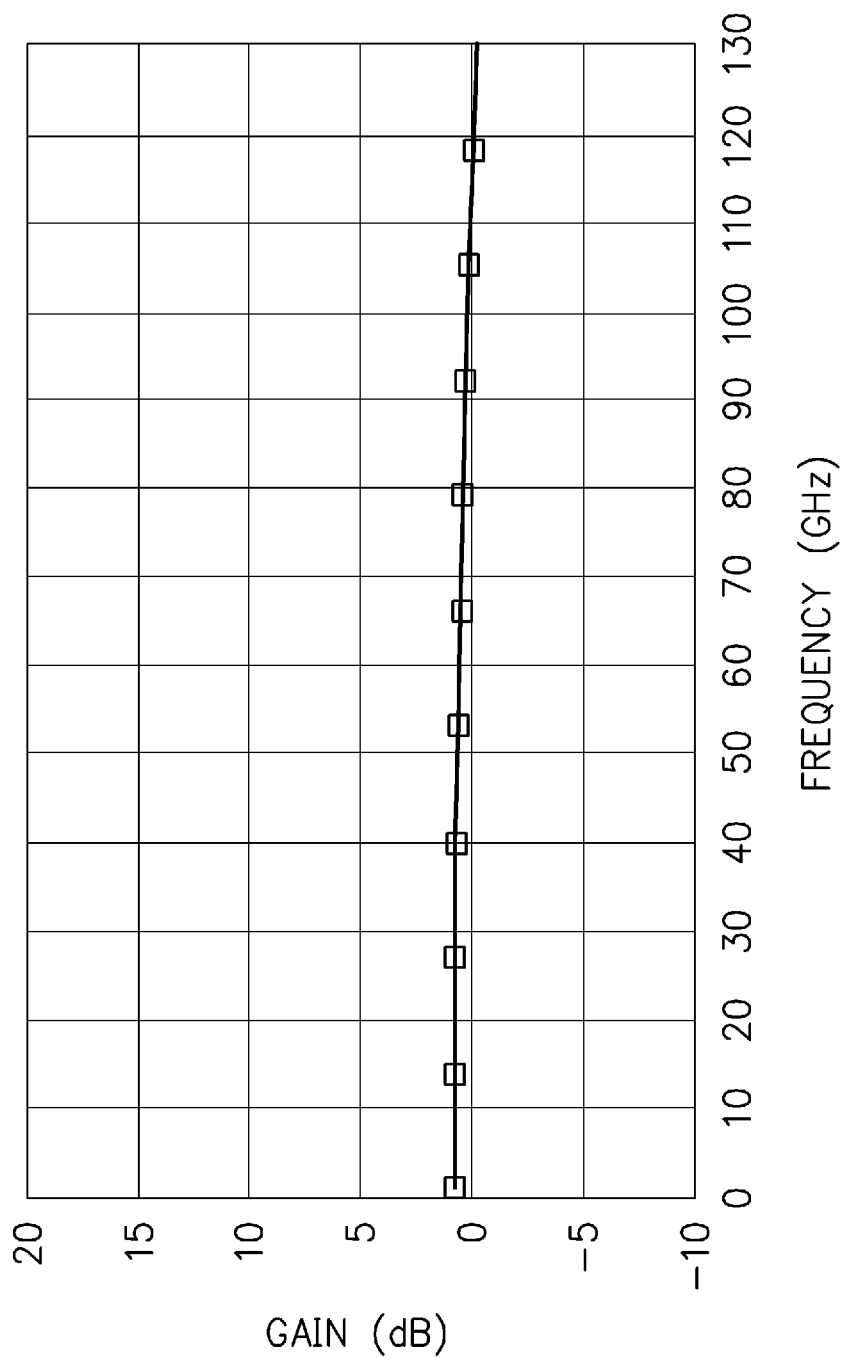
FIG. 3 is a view depicting a frequency characteristic of a voltage gain conducted practically in a circuit simulator with regard to the two-stage grounded-gate amplifier circuit in FIG. 2.

FIG. 3 is a view depicting a frequency characteristic of the voltage gain conducted practically in a circuit simulator with regard to the two-stage grounded-gate amplifier circuit in FIG. 2. The voltage gain (amplification) is almost 0 dB (one times). The two-stage grounded-gate amplifier circuit in FIG. 2 has a difficulty in increasing the gain while maintaining the input/output impedances at 50Ω.

Hereinafter, embodiments of an amplifier circuit capable of obtaining a high gain while maintaining input and output impedances at a matching value, (which is 50Ω, for example), over a broad band are explained.

First Embodiment

FIG. 4 is a circuit diagram depicting a configuration example of a two-stage grounded-gate amplifier circuit according to a first embodiment. A first n-channel field-effect transistor T1 has a source thereof connected to an input port P1 and has a gate thereof grounded in an alternating current manner. A first capacitance C1 is connected between the gate of the first n-channel field-effect transistor T1 and a reference potential (ground potential) node. A first gate bias voltage node Vg1 is connected to the gate of the first n-channel field-effect transistor T1. A second n-channel field-effect transistor T2 has a gate thereof grounded in an alternating current manner. A second capacitance C2 is connected between the gate of the second n-channel field-effect transistor T2 and a reference potential node. A second gate bias voltage node Vg2 is connected to the gate of the second n-channel field-effect transistor T2. A first inductor L1 is connected between a drain of the first n-channel field-effect transistor T1 and a source of the second n-channel field-effect transistor T2. That is, the drain of the first n-channel field-effect transistor T1 and the source of the second n-channel field-effect transistor T2 are electrically connected via the first inductor L1. A second inductor L2 is connected between a drain of the second n-channel field-effect transistor T2 and an output port P2. A load resistance RL is connected between the output port P2 and a reference potential node. The two-stage grounded-gate amplifier circuit amplifies a signal to be input to the input port P1 and outputs the amplified signal from the output port P2. A voltage Vin is a voltage of the input port P1, and a voltage Vo is a voltage of the output port P2.

In the two-stage grounded-gate amplifier circuit, an input impedance is 1/gm, and an output impedance is RL. gm is a mutual conductance of each of the transistors T1 and T2. When the input impedance and the output impedance are matched to 50Ω, RL=1/gm is obtained. Under conditions as above, a voltage gain Kv of the two-stage grounded-gate amplifier circuit is expressed by the following Expression (3). Here, ω is an angular frequency (2×π×f) of a signal to be input to the input port P1, f is a frequency, Cgd is a gate-to-drain capacitance of each of the transistors T1 and T2, and L is an inductance value of each of the inductors L1 and L2.

[Expression 3]

$$Kv = \frac{1}{(1 - \omega^2 \cdot C_{gd} \cdot L)^2 + (\omega \cdot C_{gd} \cdot R_L)^2} \quad (3)$$

Here, 1≫ ω·Cgd·RL is established, so that when a condition as above is substituted in Expression (3), the voltage gain Kv is expressed by Expression (4).

[Expression 4]

$$Kv = \frac{1}{(1 - \omega^2 \cdot C_{gd} \cdot L)^2} \geq 1 \quad (4)$$

Although the amplifier circuit in this embodiment is a simple circuit in which to the amplifier circuit in FIG. 2, the inductor L1 is only interposed between the grounded-gate transistors T1 and T2 and the inductor L2 is only interposed between the grounded-gate transistor T2 and the output of the transistor T2, an effect thereof is profound. The inductors L1 and L2 are interposed, and thereby the voltage gain Kv becomes one or more by Expression (4). As the frequency f increases, a denominator of Expression (4) approximates to zero and the voltage gain Kv is increased. When the denominator of Expression (4) is zero, the voltage gain Kv becomes the maximum. When designing the above amplifier circuit, it is only necessary to obtain the capacitance Cgd and the inductance value L so that the denominator of Expression (4) approximates to zero in the vicinity of the targeted frequency f. The gate-to-drain capacitance Cgd of each of the transistors T1 and T2 is substantially determined according to each of the transistors T1 and T2 to be used, so that it is only necessary to determine only the inductance value L practically. Numerical values are applied to Expression (4) so that the denominator of Expression (4) becomes zero, and the calculation is performed. When the capacitance Cgd is set to 10 fF and the frequency f is set to 100 GHz, for example, the inductance value L becomes 250 pH. Two hundred fifty pH is a value to enable the inductors L1 and L2 to be sufficiently integrated on a semiconductor substrate by spiral inductors or the like. Besides spiral inductors, the inductors L1 and L2 can be fabricated by inductor components of a transmission line as well, and may also be provided outside a semiconductor substrate.

In the case when the inductors L1 and L2 are configured with inductor components of a transmission line, when a characteristic impedance of the transmission line is set to Z0, a length of the transmission line is set to LN, a frequency of a signal to be input to the input port P1 is set to f, and a wavelength is set to λ, a value of the inductor component of the transmission line is Z0×LN/(f×λ). Note that f×λ becomes a velocity of light c (3×10$^8$ m/s). Obtaining the inductance value L=250 pH with the transmission line of the characteristic impedance Z0=100Ω and the wavelength λ=3 mm can be achieved by the length LN=750 μm, and the transmission line can also be integrated on a semiconductor substrate. Thus, the above amplifier circuit can be easily fabricated by an existing semiconductor manufacturing device. However, when the inductance value is L=1/(ω$^2$×Cgd), which is cited in the above-described example, the voltage gain Kv becomes infinite to cause a problem of oscillation, and thus when designing the amplifier circuit, it is necessary to make the inductance value L smaller than 1/(ω$^2$×Cgd).

Figure 5:
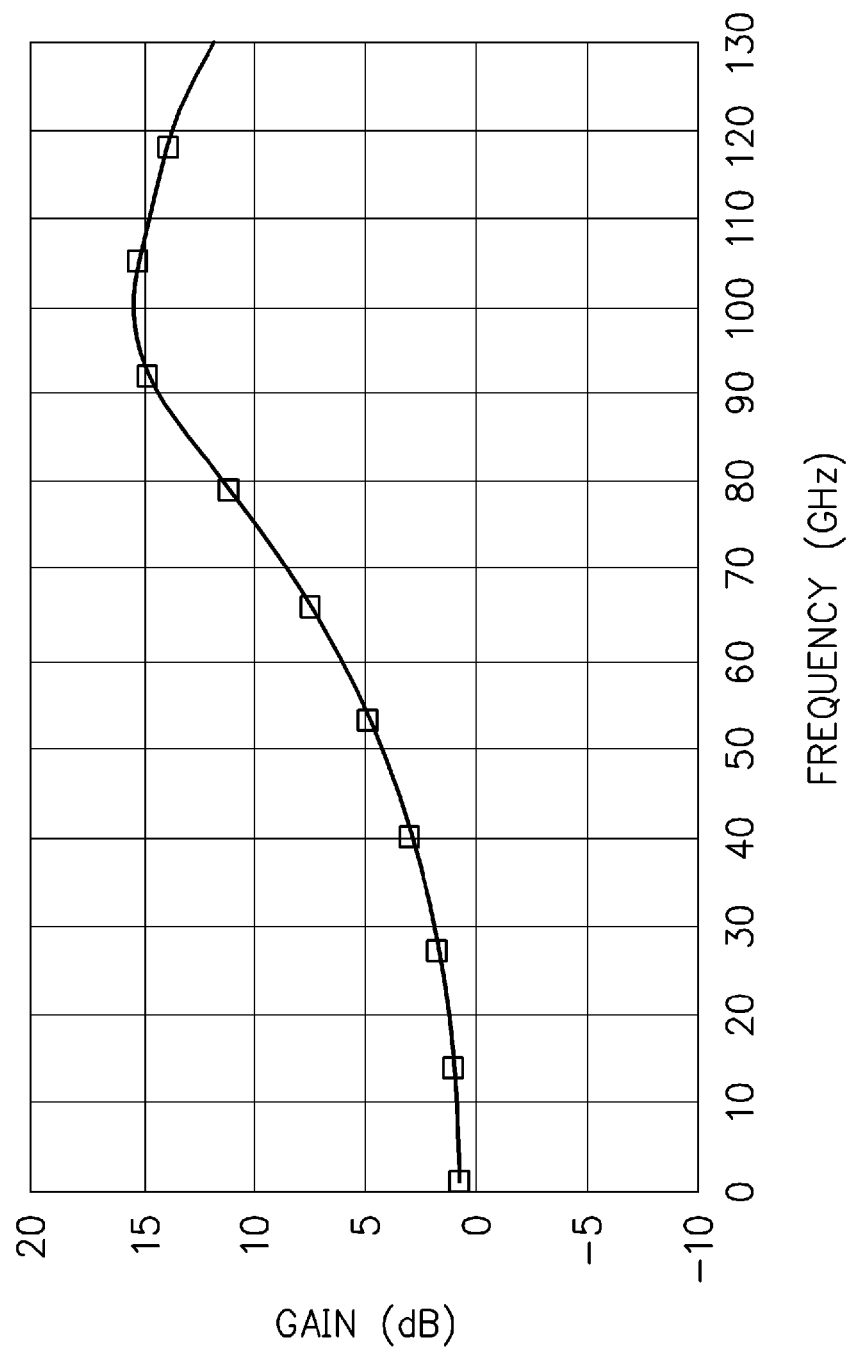
FIG. 5 is a view depicting a simulation result of a frequency characteristic of a voltage gain in the two-stage grounded-gate amplifier circuit in FIG. 4.

FIG. 5 is a view depicting a simulation result of a frequency characteristic of the voltage gain in the two-stage grounded-gate amplifier circuit in FIG. 4. In the frequency characteristic in FIG. 3, the voltage gain is almost 0 dB over all the frequencies, but in the frequency characteristic in FIG. 5, the voltage gain can be greatly increased to 15 dB at 100 GHz. The above amplifier circuit can be fabricated by a semiconductor chip size of 0.7×0.65 mm$^2$.

Incidentally, in the above-described explanation, the two-stage grounded-gate amplifier circuit is explained as an example, but a three or more-stage grounded-gate amplifier circuit can also be applied. In the above case as well, the advantage that a gain can be improved while maintaining input/output impedances at a matching value can be obtained.

Second Embodiment

FIG. 6 is a circuit diagram depicting a configuration example of a two-stage grounded-gate amplifier circuit according to a second embodiment. This embodiment (FIG. 6) is such that DC cut capacitors (capacitances) 601 and 611, RF (high frequency) choke coils (inductors) 602 and 612, and power supplies (current sources) 603 and 613 are added to the first embodiment (FIG. 4). Hereinafter, points where this embodiment differs from the first embodiment are explained.

The DC cut capacitor 601 is connected between an input port P1 and a source of a first n-channel field-effect transistor T1, and can cut a direct current to the outside of the input port P1. A series-connected circuit composed of the RF choke coil 602 and the power supply (current source) 603 is connected between the source of the first n-channel field-effect transistor T1 and a reference potential node. The DC cut capacitor 611 is connected between a second inductor L2 and an output port P2, and can cut a direct current to the outside of the output port P2. A series-connected circuit composed of the RF choke coil 612 and the power supply (current source) 613 is connected between an interconnection point between the second inductor L2 and the DC cut capacitor 611 and a reference potential node.

The power supplies 603 and 613 are power supplies for supplying a drain bias current to the input port P1 from the output port P1. In this embodiment, the power supplies 603 and 613 that are capable of supplying a direct current to an initial stage and a final stage of the amplifier circuit are provided. Accordingly, in the transistors T1 and T2, the drain bias current flows between each of the drains and each of the sources. Thus, the above amplifier circuit is simply configured to enable the current to be supplied only to the initial stage and the final stage, thereby enabling a bias to be supplied to the entire circuit. This makes it possible to simplify a bias circuit. Note that the power supplies 603 and 613 are not limited to the current sources, and may also be voltage sources.

Third Embodiment

Figure 8:
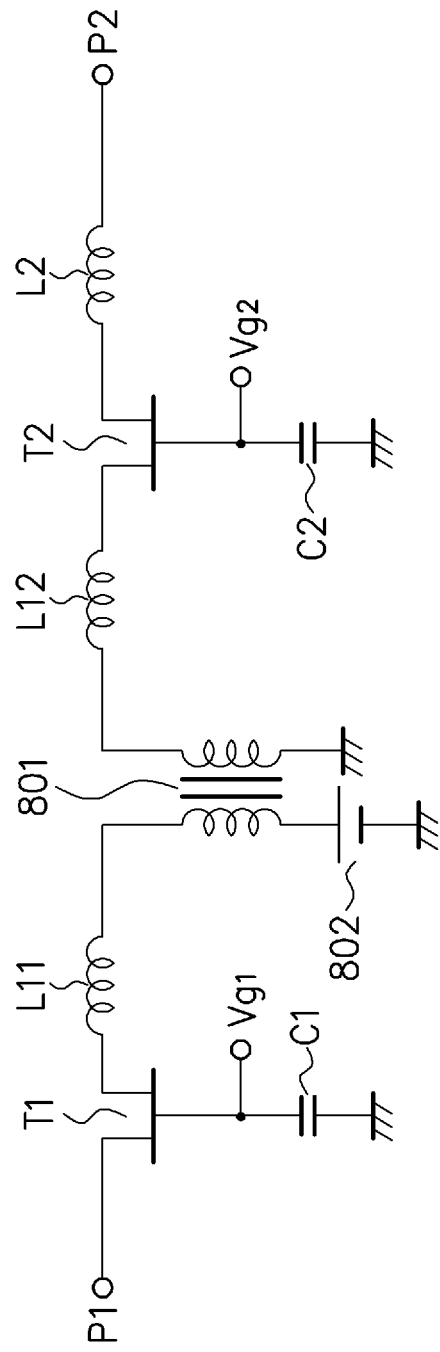
FIG. 8 is a circuit diagram depicting a configuration example of a two-stage grounded-gate amplifier circuit according to a third embodiment.

FIG. 8 is a circuit diagram depicting a configuration example of a two-stage grounded-gate amplifier circuit according to a third embodiment. This embodiment (FIG. 8) is such that a transformer 801 and a voltage source 802 are added to the first embodiment (FIG. 4). Hereinafter, points where this embodiment differs from the first embodiment are explained. Inductors L11 and L12 correspond to the first inductor L1 in FIG. 4. The transformer 801 has a primary side inductor (coil) and a secondary side inductor (coil). A series-connected circuit composed of the inductor L11 and the primary side inductor of the transformer 801 is connected between a drain of a first n-channel field-effect transistor T1 and a positive pole of the voltage source 802. A negative pole of the voltage source 802 is connected to a reference potential node. The voltage source 802 can supply a drain bias current of the first n-channel field-effect transistor T1. A series-connected circuit composed of the inductor L12 and the secondary side inductor of the transformer 801 is connected between a source of a second n-channel field-effect transistor T2 and a reference potential node. The transformer 801 magnetically couples the drain of the first n-channel field-effect transistor T1 and the source of the second n-channel field-effect transistor T2 via the inductors L11 and L12 to transmit a signal. The above amplifier circuit can obtain a voltage gain Kv that is the same as that obtained by the above-described Expression (4).

Fourth Embodiment

Figure 9:
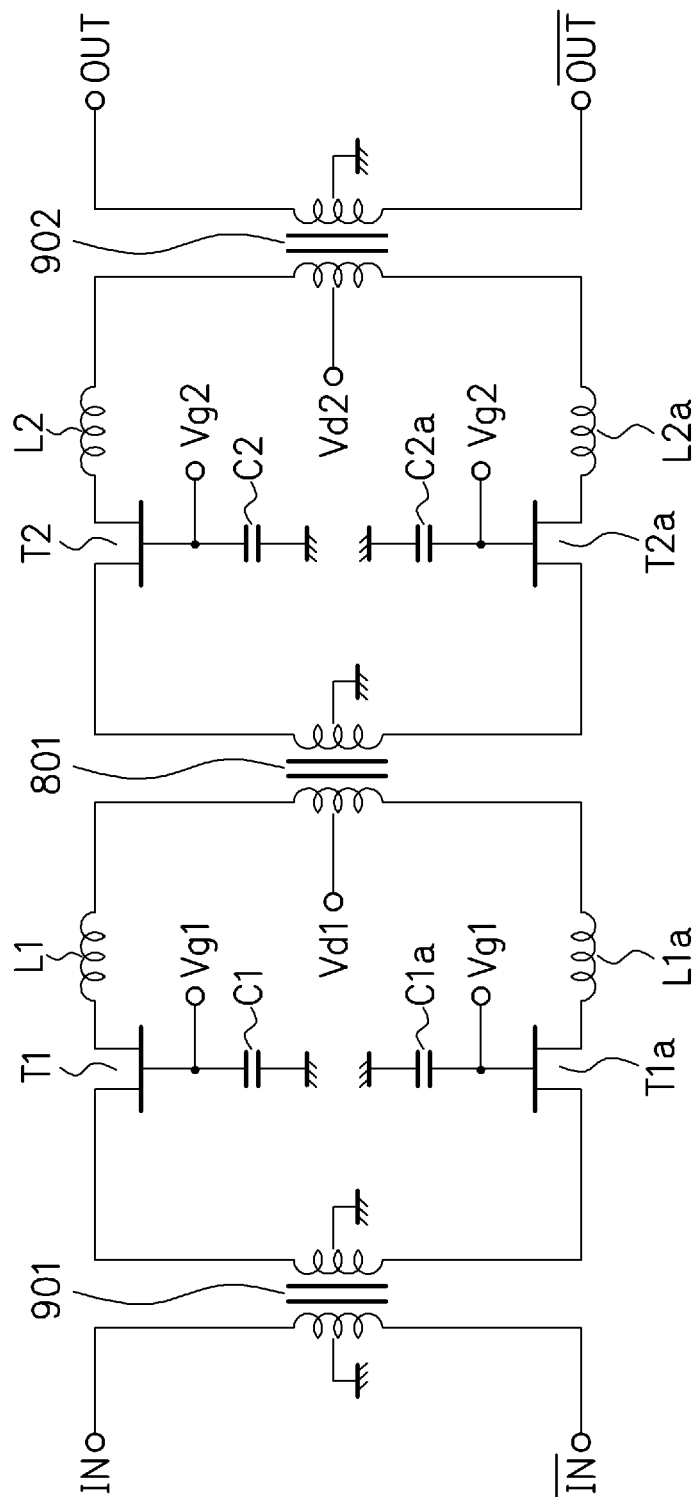
FIG. 9 is a circuit diagram depicting a configuration example of a two-stage grounded-gate amplifier circuit according to a fourth embodiment.

FIG. 9 is a circuit diagram depicting a configuration example of a two-stage grounded-gate amplifier circuit according to a fourth embodiment. In the third embodiment, the case when an input port P1 is a single-end input and an output port P2 is a single-end output is explained. In this embodiment, the case when input ports IN and /IN are differential inputs and output ports OUT and /OUT are differential outputs is explained. Hereinafter, points where this embodiment (FIG. 9) differs from the third embodiment (FIG. 8) are explained. Differential signals are input to the input ports IN and /IN. A transformer 901 has a primary side inductor (coil) and a secondary side inductor (coil). The primary side inductor of the transformer 901 has a midpoint thereof connected to a reference potential node (ground potential node), and is connected between the input ports IN and /IN. The secondary side inductor of the transformer 901 has a midpoint thereof connected to a reference potential node, and is connected between a source of an n-channel field-effect transistor T1 and a source of an n-channel field-effect transistor T1a. A capacitance C1 is connected between a gate of the n-channel field-effect transistor T1 and a reference potential node. The gate of the n-channel field-effect transistor T1 is connected to a gate bias voltage node Vg1. A capacitance C1a is connected between a gate of the n-channel field-effect transistor T1a and a reference potential node. The gate of the n-channel field-effect transistor T1a is connected to a gate bias voltage node Vg1.

A transformer 801 has a primary side inductor and a secondary side inductor. An inductor L1 is connected between a drain of the n-channel field-effect transistor T1 and the primary side inductor of the transformer 801. An inductor L1a is connected between a drain of the n-channel field-effect transistor T1a and the primary side inductor of the transformer 801. A midpoint of the primary side inductor of the transformer 801 is connected to a voltage node Vd1. The secondary side inductor of the transformer 801 has a midpoint thereof connected to a reference potential node, and is connected between a source of an n-channel field-effect transistor T2 and a source of an n-channel field-effect transistor T2a. A capacitance C2 is connected between a gate of the n-channel field-effect transistor T2 and a reference potential node. The gate of the n-channel field-effect transistor T2 is connected to a gate bias voltage node Vg2. A capacitance C2a is connected between a gate of the n-channel field-effect transistor T2a and a reference potential node. The gate of the n-channel field-effect transistor T2a is connected to a gate bias voltage node Vg2.

A transformer 902 has a primary side inductor and a secondary side inductor. An inductor L2 is connected between a drain of the n-channel field-effect transistor T2 and the primary side inductor of the transformer 902. An inductor L2a is connected between a drain of the n-channel field-effect transistor T2a and the primary side inductor of the transformer 902. A midpoint of the primary side inductor of the transformer 902 is connected to a voltage node Vd2. The secondary side inductor of the transformer 902 has a midpoint thereof connected to a reference potential node, and is connected between the output ports OUT and /OUT. The differential signals are output from the output ports OUT and /OUT. The amplifier circuit in this embodiment can obtain a high voltage gain Kv similarly to the amplifier circuit in the third embodiment.

Fifth Embodiment

Figure 7:
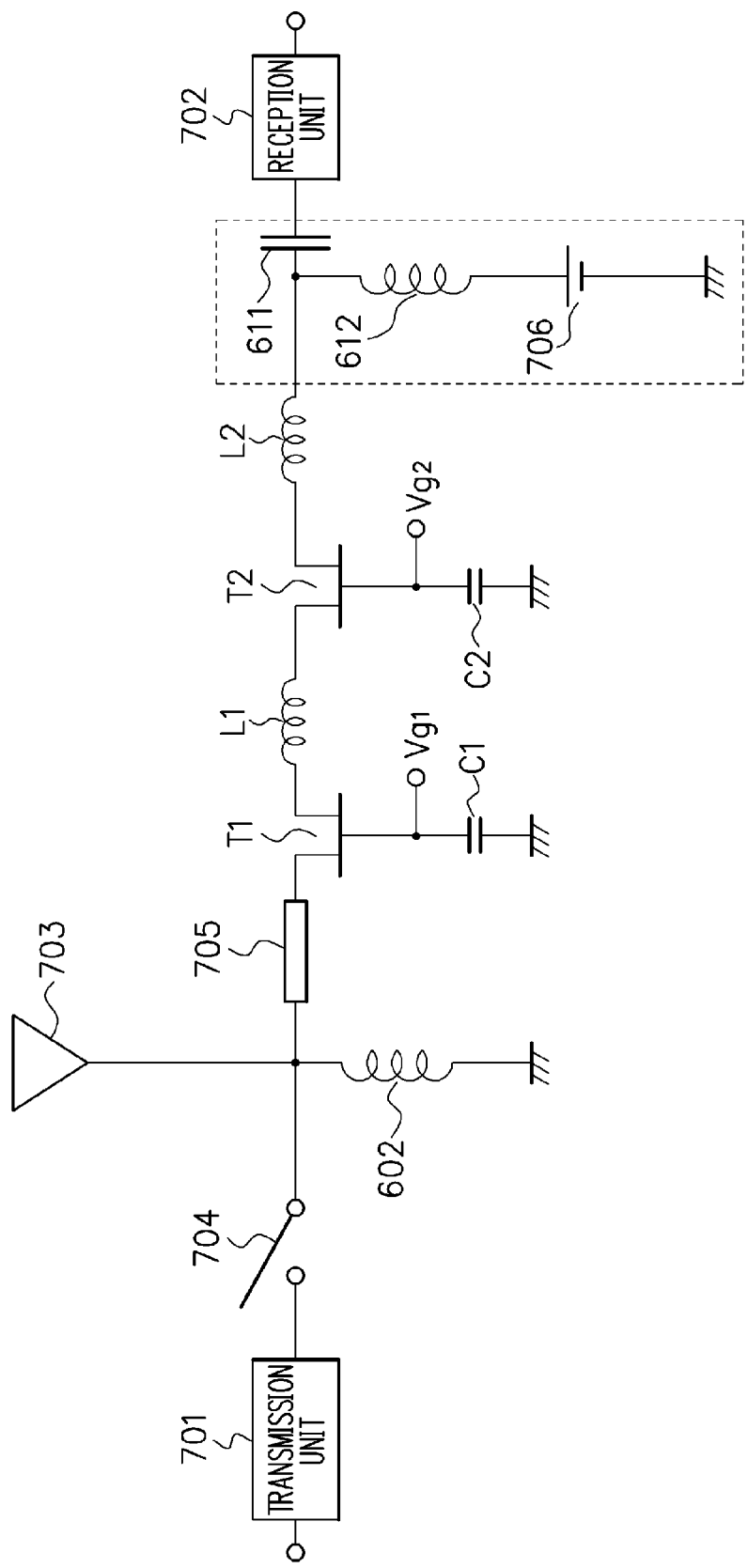
FIG. 7 is a circuit diagram depicting a configuration example of a communication device according to a fifth embodiment.

FIG. 7 is a circuit diagram depicting a configuration example of a communication device according to a fifth embodiment. The above communication device has the two-stage grounded-gate amplifier circuit in the second embodiment (FIG. 6). Hereinafter, points where this embodiment differs from the second embodiment are explained. The communication device has a transmission unit 701, a reception unit 702, an antenna 703, a switch 704 and the amplifier circuit in FIG. 6. The switch 704 is connected between the transmission unit 701 and the antenna 703. The amplifier circuit in FIG. 6 is connected between the antenna 703 and the reception unit 702. That is, the antenna 703 is connected to the input port P1 of the amplifier circuit. The reception unit 702 is connected to the output port P2 of the amplifier circuit. A transmission line 705 is connected between the antenna 703 and the source of the first n-channel field-effect transistor T1. A voltage source 706 corresponds to the power supply 613 in FIG. 6, and has a positive pole thereof connected to the interconnection point between the second inductor L2 and the DC cut capacitor 611 via the RF choke coil 612, and has a negative pole thereof connected to a reference potential node. In the above case, the power supply 603 in FIG. 6 can be omitted, and the RF choke coil 602 is connected between the antenna 703 and a reference potential node. In a transmission mode, the transmission unit 701 transmits a signal via the antenna 703. In a reception mode, the reception unit 702 receives a signal via the antenna 703. The voltage source 706 can supply a drain bias current to the input port P1 from the output port P2 of the amplifier circuit.

First, the reception mode is explained. In the reception mode, the voltage source 706 supplies the drain bias current to the transistors T1 and T2 to thereby output an amplified signal from the output port P2 of the amplifier circuit. The amplifier circuit receives the supply of the drain bias current to thereby amplify a signal input from the antenna 703 (input port P1) and output the amplified signal to the reception unit 702 (output port P2). The reception unit 702 receives the signal amplified in the amplifier circuit. Note that in the reception mode, the switch 704 is off (in an open state).

Next, the transmission mode is explained. In the transmission mode, the switch 704 is turned on (closed). The transmission unit 701 transmits a signal via the switch 704 and the antenna 703. Further, in the transmission mode, the voltage source 706 stops supplying the drain bias current to the transistors T1 and T2 to thereby cut a signal path between the input port P1 (antenna 703) and the output port P2 (reception unit 702) of the amplifier circuit. That is, the amplifier circuit functions as an off state of a switch.

As described above, it is possible to make the amplifier circuit possess a switching function. In the reception mode, the switch 704 between the transmission unit 701 and the antenna 703 is turned off, and the voltage source 706 supplies a bias voltage to the amplifier circuit to make the amplifier circuit perform an amplifying operation. In the transmission mode, the switch 704 between the transmission unit 701 and the antenna 703 is turned on, and the voltage source 706 does not supply the bias voltage to the amplifier circuit. In the above case, the transistors T1 and T2 are brought into an almost open state, so that the above amplifier circuit can achieve an open state of a switch. Accordingly, it is possible to make the amplifier circuit possess the switching function. In the above-described explanation, the case when the amplifier circuit having the switching function is provided between the reception unit 702 and the antenna 703 is explained as an example, but similarly, the amplifier circuit having the switching function can also be used for the switch 704 between the transmission unit 701 and the antenna 703. Further, the communication device may also use the amplifier circuit in the third embodiment (FIG. 8) or the amplifier circuit in the fourth embodiment (FIG. 9) instead of the amplifier circuit in the second embodiment (FIG. 6).

As described above, in the first to fifth embodiments, the first inductor L1 is provided between the drain of the first grounded-gate transistor T1 and the source of the second grounded-gate transistor T2, and the second inductor L2 is provided between the drain of the second grounded-gate transistor T2 and the output port P2. This makes it possible to maintain the input and output impedances at a matching value, (which is 50Ω, for example), over a broad band and to obtain a high gain. At a high frequency in particular, a gain can be increased. The amplifier circuits in the first to fourth embodiments each can be used for, for example, a millimeter wave radar for an automobile, a broadband wireless LAN system, or the like, and can amplify a high frequency signal.

It is possible to maintain the input and output impedances at a matching value, (which is 50Ω, for example), over a broad band and to obtain a high gain. At a high frequency in particular, a gain can be increased.

Note that the above-described embodiments merely illustrate concrete examples of implementing the present embodiments, and the technical scope of the present embodiments is not to be construed in a restrictive manner by these embodiments. That is, the present embodiments may be implemented in various forms without departing from the technical spirit or main features thereof.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has (have) been described in detail, it should be understood that the various changes, substitutions, and alterations could be made hereto without departing from the spirit and scope of the invention.

What is claimed is:

1. An amplifier circuit comprising:
   a first transistor having a source thereof connected to an input port and having a gate thereof grounded;
   a second transistor having a gate thereof grounded;
   a first inductor provided between a drain of the first transistor and a source of the second transistor;
   a second inductor provided between a drain of the second transistor and an output port; and
   a power supply supplying a bias current to the input port from the output port,
   wherein the dower supply supplies the bias current, thereby outputting an amplified signal from the output port, and the power supply stops supplying the bias current, thereby cutting a signal path between the input port and the output port.

2. The amplifier circuit according to claim 1, wherein the drain of the first transistor and the source of the second transistor are electrically connected via the first inductor.

3. The amplifier circuit according to claim 1, further comprising:
   a transformer magnetically coupling the drain of the first transistor and the source of the second transistor via the first inductor.

4. The amplifier circuit according to claim 1, wherein when a gate-to-drain capacitance of each of the first and second transistors is set to Cgd and an angular frequency of a signal to be input to the input port is set to $\omega$, a value of each of the first and second inductors is smaller than $1/(\omega^2 \times Cgd)$.

5. The amplifier circuit according to claim 1, wherein the first and second inductors are inductor components of a transmission line, and
   when a characteristic impedance of the transmission line is set to Z0, a length of the transmission line is set to LN, a frequency of a signal to be input to the input port is set to f, and a wavelength is set to $\lambda$, a value of the inductor component of the transmission line is $Z0 \times LN/(f \times \lambda)$.

6. The amplifier circuit according to claim 1, further comprising:
   a first capacitance connected between a gate of the first transistor and a reference potential node; and
   a second capacitance connected between a gate of the second transistor and the reference potential node,
   wherein
   the gate of the first transistor is connected to a first gate bias voltage node, and the gate of the second transistor is connected to a second gate bias voltage node.

7. A communication device comprising:
   an antenna;
   a reception unit receiving a signal via the antenna; and
   an amplifier circuit connected between the antenna and the reception unit, and wherein
   the amplifier circuit comprises:
   an input port connected to the antenna;
   an output port connected to the reception unit;
   a first transistor having a source thereof connected to the input port and having a gate thereof grounded;
   a second transistor having a gate thereof grounded;
   a first inductor provided between a drain of the first transistor and a source of the second transistor; and
   a second inductor provided between a drain of the second transistor and the output port.

8. The communication device according to claim 7, wherein
   the drain of the first transistor and the source of the second transistor are electrically connected via the first inductor.

9. The communication device according to claim 7, wherein
   the amplifier circuit further comprises a transformer magnetically coupling the drain of the first transistor and the source of the second transistor via the first inductor.

10. The communication device according to claim 7, wherein
    the amplifier circuit further comprises a power supply supplying a bias current to the input port from the output port.

11. The communication device according to claim 10, wherein
    the power supply supplies the bias current, thereby outputting an amplified signal from the output port, and the power supply stops supplying the bias current, thereby cutting a signal path between the input port and the output port.

12. The communication device according to claim 7, wherein
    when a gate-to-drain capacitance of each of the first and second transistors is set to Cgd and an angular frequency of a signal to be input to the input port is set to $\omega$, a value of each of the first and second inductors is smaller than $1/(\omega^2 \times Cgd)$.

13. The communication device according to claim 7, wherein
    the first and second inductors are inductor components of a transmission line, and
    when a characteristic impedance of the transmission line is set to Z0, a length of the transmission line is set to LN, a frequency of a signal to be input to the input port is set to f, and a wavelength is set to $\lambda$, a value of the inductor component of the transmission line is $Z0 \times LN/(f \times \lambda)$.

14. The communication device according to claim 7, further comprising:
    a first capacitance connected between a gate of the first transistor and a reference potential node; and
    a second capacitance connected between a gate of the second transistor and the reference potential node,
    wherein
    the gate of the first transistor is connected to a first gate bias voltage node, and the gate of the second transistor is connected to a second gate bias voltage node.

* * * * *